United States Patent [19]

Cavigelli

[11] Patent Number: 5,635,871
[45] Date of Patent: Jun. 3, 1997

[54] LOW PHASE ERROR AMPLIFYING

[75] Inventor: George A. Cavigelli, Lexington, Mass.

[73] Assignee: Doble Engineering Company, Watertown, Mass.

[21] Appl. No.: 990,894

[22] Filed: Dec. 15, 1992

[51] Int. Cl.$^6$ .................................................... H03F 1/34
[52] U.S. Cl. ........................................ 330/107; 330/294
[58] Field of Search .............................. 330/107, 109, 330/294; 307/520; 328/167

[56] References Cited

U.S. PATENT DOCUMENTS

| | | | |
|---|---|---|---|
| 3,512,102 | 5/1970 | Kubach | 330/107 |
| 3,789,325 | 1/1974 | Hoffman | 333/28 R |
| 3,796,971 | 3/1974 | Sherman | 333/17 |
| 3,898,573 | 8/1975 | Sherman | 328/167 |
| 3,900,823 | 8/1975 | Sokal et al. | 330/149 |
| 3,955,155 | 5/1976 | Behrend | 332/1 |
| 4,110,798 | 8/1978 | Miller et al. | 360/65 |
| 4,320,354 | 3/1982 | Harrison | 330/306 |
| 4,547,819 | 10/1985 | Meitner et al. | 360/65 |

FOREIGN PATENT DOCUMENTS

| | | | |
|---|---|---|---|
| 212208 | 9/1988 | Japan | 330/294 |
| 1383204 | 2/1975 | United Kingdom | 330/107 |

OTHER PUBLICATIONS

Inouye et al, "A New Second–Order Multifunctional RC–Active Filter Circuit Using Toso Operational Amplifiers," *Electrical Engineering In Japan*, vol. 100, No. 1, Feb. 1980, pp. 117–122.

Sabah, "A Low–Pass Active Filter With Phase–Lead Compensation", *J. Phys. E: Sci. Instruments*, vol. 14, No. 2, Feb. 1981.

Salerno, "Active Filters: Part 7 Analog Blocks Ensure Stable Design" *Electronics*, Feb. 17, 1969, pp. 100–105.

Soliman, "Phase Correction In Two–Integrator Loop Filters Using New Variable–Phase Inverting Amplifier", *Electronics Letters*, Feb. 28, 1980, vol. 16, No. 5, pp. 186–188.

Prabhaker et al, "New RC Synthesis Procedures Using Integrated Circuit Amplifiers," Institution Of Engineers, Electrical Engineering Transactions, vol. EE–12, No. 1, 1976, pp. 4–7.

Khan and Kumar, "A novel wide–band differential amplifier," IEEE Transactions on Instrumentation and Measurement 41:555–559 (1992). Aug. 1992.

Khan and Kumar, "A novel noninventing VCVS with reduced magnitude and phase errors," IEEE Transactions on Instrumentation and Measurement 40:919–923 (1991). Dec.. 1991.

Khan and Kumar, "A novel instrumentation amplifier with reduced magnitude and phase errors," IEEE Transactions on Instrumentation and Measurement 40:1035–1038 (1991). Dec. 1991.

Pease, "Technique trims op–amp amplifiers for low phase shift," EDN, p. 138, Aug. 20, 1977.

Wong, "Active feedback improves amplifier phase accuracy," EDN, pp. 179–188, Sep. 17, 1987.

*Primary Examiner*—James B. Mullins
*Attorney, Agent, or Firm*—Fish & Richardson P.C.

[57] ABSTRACT

The invention features an apparatus and technique for amplifying a signal without creating a phase error. The apparatus is an active device with a restricted band width selected to include desired frequencies of operation. The apparatus includes at least one amplifier with a local feedback loop, formed by a network, constructed and arranged to exhibit a high forward gain at the operating frequencies. The amplifier and the network are constructed and arranged to provide substantially 180 degree phase shift between an input voltage and an output voltage at the operating frequencies. The apparatus also includes a signal input node adapted to introduce the input voltage to the inverting input of the amplifier, a signal output node adapted to obtain the output voltage from the output of the amplifier, and a resistive global feedback loop that connects the signal input and signal output nodes and controls the closed loop gain of the amplifying apparatus.

26 Claims, 13 Drawing Sheets

LOW PHASE ERROR AMPLIFYING

BACKGROUND OF THE INVENTION

The present invention relates to active devices such as amplifiers with a very low phase error.

There are several applications that require a stable amplifier with a very low phase error. For example, to achieve precise power factor measurement (i.e., measurement of the phase shift between the voltage across and current through a component), the phase shift in a small resistance connected in series with the component is measured. The measurement system requires an amplifier with a low phase error, independent over time and temperature variation.

For background information, reference is made to amplifiers with active feedback described by J. Wong in EDN Sep. 17, 1987, and by A. A. Khan in IEEE Transaction on Instrumentation and Measurement Vol. 41, No. 4, p 555; and to amplifiers that use a feedback trim to adjust the phase, as described by R. A. Pease in EDN, Aug. 20, 1977, p. 138.

It is an important object of the invention to provide apparatus and technique for amplifying a signal without creating a phase error. The apparatus is an active device with a restricted band width selected to include a desired frequency band of operation. The device includes one or more cascaded amplifiers, each with a local feedback loop that establish a high forward gain, and an RC network arranged to maintain the phase shift at 180°. The phase error is independent of the time and temperature fluctuations in the amplifier itself.

In one aspect, the invention features an amplifying apparatus having a nearly zero phase error at desired operating frequencies. The apparatus comprises at least one amplifier, including local feedback loop, formed by a network, constructed and arranged to exhibit a high forward gain at the operating frequencies. The amplifier and the network are constructed and arranged to provide substantially 180 degree phase shift between an input voltage and an output voltage at the operating frequencies. The apparatus also comprises a signal input node adapted to introduce the input voltage to the inverting input of the amplifier, a signal output node adapted to obtain the output voltage from the output of the amplifier, and a resistive global feedback loop that connects the signal input and signal output nodes and controls the closed loop gain of the amplifying apparatus.

In another aspect, the invention features an amplifying apparatus exhibiting a nearly zero phase error at desired operating frequencies. The apparatus comprises three cascaded amplifiers including local feedback loops, formed by a network constructed and arranged to exhibit a high forward gain, at the operating frequencies, wherein each amplifier with its respective local feedback loop is arranged to form a low pass filter. The network has, at the desired frequency band, substantially 180 degree phase shift between an input voltage and an output voltage of the amplifying apparatus. The apparatus also comprises a resistive global feedback loop arranged to connect the output of the third amplifier and the input of the first amplifier. The global feedback loop is adapted to control the closed loop gain of the apparatus.

In another aspect, the invention features an amplifying apparatus having a nearly zero phase error at desired operating frequencies. The apparatus comprises an amplifier, having inverting and noninverting inputs and an output, constructed and arranged to operate as a low pass filter with a high gain and to have a cut-off frequency substantially below the operating frequencies. The apparatus also comprises a signal input node adapted to introduce an input voltage to the inverting input, a signal output node adapted to obtain an output voltage from the output of the amplifier, and a capacitor-resistor network constructed and arranged to provide, in connection with the amplifier, substantially 180 degree phase shift between the input voltage and the output voltage at the operating frequencies. A resistive global feedback loop connects the signal input and signal output nodes and is adapted to control the closed loop gain of the amplifying apparatus.

The capacitor-resistor network is connected either between the signal input node and the negative input of the amplifier, or, alternatively, the capacitor-resistor network is connected between the output of the amplifier and the signal output node.

Preferred embodiments of these aspects of the invention may include one or more of the following features.

At least one amplifier further comprises a phase compensation network arranged to increase the frequency range over which the 180 degree phase shift is achieved.

The local feedback loop of at least one amplifier is formed by a capacitor and a resistor connected in parallel adapted to establish a cut-off frequency substantially above the desired frequency band.

At least one amplifier further comprises an input network of a capacitor-resistor loop and a resistor loop connected in parallel acting as a phase lead network to provide a phase margin.

At least one amplifier further comprises a phase compensation network arranged to increase a frequency range over which the 180 degree phase shift is achieved.

The amplifying apparatus further comprises a high frequency noise reduction stage, cascaded to the three amplifiers, constructed and arranged to reduce noise of frequencies substantially above the operating frequency band.

The capacitor resistor network comprises a first passive low pass filter with a cut-off frequency substantially below the operation frequency, and a second passive low pass filter with a cut-off frequency substantially above the operation frequency.

The network also comprises a high frequency attenuator adapted to reduce the forward gain at high frequencies.

Each amplifier may comprise a capacitor adapted and arranged for external compensation.

The desired frequencies of operation are in the range of 50 Hz to 60 Hz.

In another aspect, the invention features an amplifying apparatus having a nearly zero phase error at a desired frequency band. The apparatus comprises at least two cascaded amplifiers with local feedback loops with a network constructed and arranged to exhibit a high forward gain wherein the local feedback loops are constructed and arranged to establish a predetermined restricted pass band containing frequency. The network has, at the operating frequencies, substantially 180° phase shift between an input voltage and an output voltage. The apparatus also comprises a resistive global feedback loop arranged to connect the output of the second amplifier and the input of the first amplifier, wherein the global feedback loop is adapted to control the closed loop gain of the amplifying apparatus.

Preferred embodiments of this aspect of the invention may include one or more of the following features.

Each of the amplifiers with the local feedback is loop is constructed and arranged to form a high pass filter.

Each of the amplifiers with the local feedback loop is constructed and arranged to form a low pass filter.

The overall gain may be one or larger than one.

The operation frequency is in the range of 50 Hz to 60 Hz.

Other features and advantages will become apparent from the following detailed description when read in connection with the accompanying drawing in which:

Figure 1:
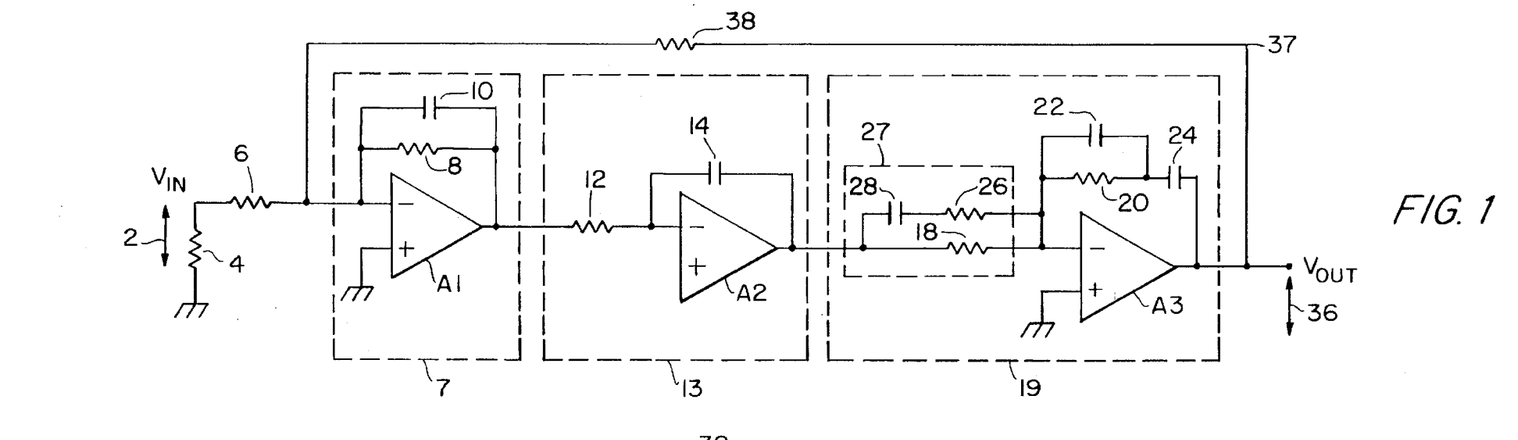
FIG. 1 is a schematic circuit diagram of a nearly zero phase error amplifier system according to one embodiment of the invention.

With reference now to the drawings and more particularly FIG. 1 thereof, an amplifier system with zero phase error includes an input resistor 6, three low pass amplifying stages 7, 13, and 19 cascaded together, and a feedback resistor 38 arranged in a global feedback loop 37.

An input voltage $V_{in}$, applied across a resistor 4, is coupled to the inverting input of an operational amplifier A1 of the first stage that is cascaded with an operational amplifier A2 of the second stage and further connected to an input network 27 of an operational amplifier A3 of the third stage. Each of the operational amplifiers includes one or more local feedback loops.

Having broadly described the physical arrangement of the system of FIG. 1, we now turn to its mode of operation. Input resistor 6 and feedback resistor 8 determine the closed loop voltage gain of operational amplifier A1. Amplifier A1 is a integrator with capacitor 10 and resistor 8 connected in parallel to form its local feedback loop. Capacitor 10 and resistor 8 define the cut-off frequency $(f_o = (2\pi R_8 C_{10})^{-1})$ of the first stage. The output from the first stage is coupled to the negative input of integrator A2 of the second stage, which is then cascaded to input network 27 connected to the negative input of operational amplifier A3. The second stage exhibits the 90° phase shift, affected by selection of capacitor 14 substantially below a selected frequency of operation. The local feedback network of amplifier A3 is arranged to provide a large forward gain at low frequencies and a plateau in the roll-off at frequencies controlled by selection of capacitors 22 and 24 and a resistor 20. The 90° phase shift, controlled by capacitors 22 and 24, is again substantially below the frequency of operation. Each local feedback loop affects the forward gain of the amplifier system, and resistance 38 of the global feedback loop together with input resistance 6 govern the closed loop gain of the amplifier system. The overall gain of the system is the ratio of the forward gain and the closed loop gain.

Figure 2:
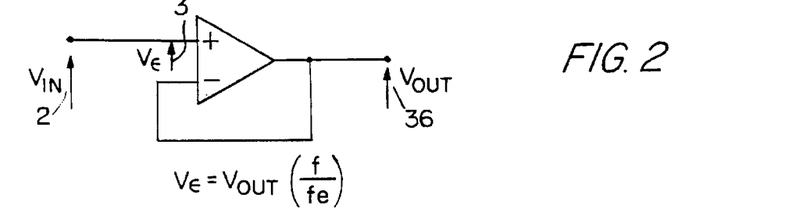
FIGS. 2A, 2B, 2C, and 2D are vector representations of voltages across an amplifier shown in FIG. 2.
Figure 2A:
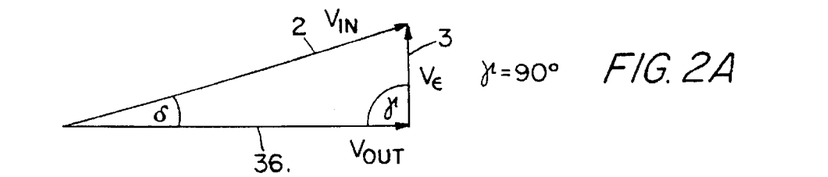
Figure 2B:
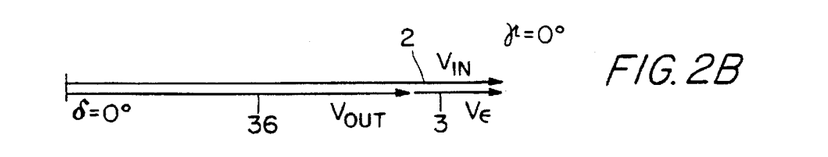
Figure 2C:
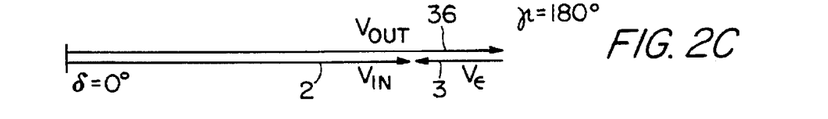
Figure 2D:
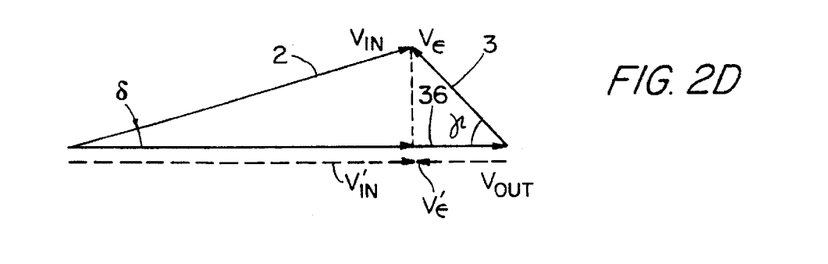

Referring to FIG. 2A, a phase error, δ, of an amplifier is defined as a phase difference between input voltage $V_i$ (vector 2), coupled to the amplifier, and output voltage $V_{out}$ (vector 36) from the amplifier. A phase shift, γ, is the phase difference between the voltage across the amplifier inputs $V_\epsilon$ (vector 3) and the amplifier output voltage $V_{out}$ as shown in FIG. 2. In general, for a single stage amplifier connected as a voltage follower, the phase shift is zero at very low frequencies (FIG. 2B). Above the cut-off frequency $f_o$, the phase shift increases to minus 90° (FIG. 2A). At frequencies above the cut-off frequency $f_o$, the open loop gain of an amplifier (A≈100 dB) usually rolls off at 20 dB per decade and reaches 0 dB at a gain bandwidth frequency $f_c$. At frequency substantially above $f_o$ wherein γ=90° and $f_o < f < f_c$, the voltage across the amplifier inputs is $V_\epsilon = V_{out} (f/f_c)$. Further increase in the phase shift from minus 90° to minus 180° (for example, by adding an additional amplifier) aligns $V_\epsilon$ and $V_{out}$ and reduces the phase error δ to nearly zero (FIG. 2C). However, to achieve sufficient stability, the high frequency roll-off of the system should be decreased to obtain phase shift γ<180° in the vicinity of the loop cross over frequency. FIG. 2D shows a vector diagram of a nonzero phase error between the input voltage and the output voltage of the amplifier system. (The magnitude of the phase error δ is exaggerated for clarity). The following equations are derived from the vector triangle of FIG. 2D:

$$V'_i \tan\delta = V'_\epsilon \tan\gamma \quad (1)$$

wherein $V'_i = V_i \cos\delta$, $V'_\epsilon = V_\epsilon \cos\gamma$, and $$V_i \cos\delta + V_\epsilon \cos\gamma = V_{out} \quad (2)$$

For amplifier systems with high loop gain, $V_\epsilon$ is much smaller then $V_{out}$, using equations (1) and small angle approximation (cosδ≈1) we get:

$$\tan\delta = \frac{V_\epsilon}{V_{out} + V_\epsilon} \tan\gamma \quad (3)$$

From Eq. (3) and using $V_\epsilon \ll V_{out}$ we get:

$$\tan\delta = \frac{1}{\text{gain}} \tan\gamma \quad (4)$$

wherein $V_\epsilon/V_{out}$ is the loop gain of the amplifier system. Thus, the resulting overall phase error δ is proportional to the deviation of the phase shift from minus 180° reduced by the loop gain of the system.

The above-described topology is not the only possible topology for a low phase error amplifier. The main criterion for selecting a particular network is to obtain the 180° phase shift at a desired frequency (or frequency band). Furthermore, the amplifier system has a high forward gain controlled by the local feedback loops to minimize the phase error dependence on the individual amplifiers. This arrangement reduces the phase error dependence on the individual amplifiers since the time-temperature variations in the phase error are controlled by selection of RC components with known temperature coefficients. The global feedback of the network is frequency independent.

Figure 3:
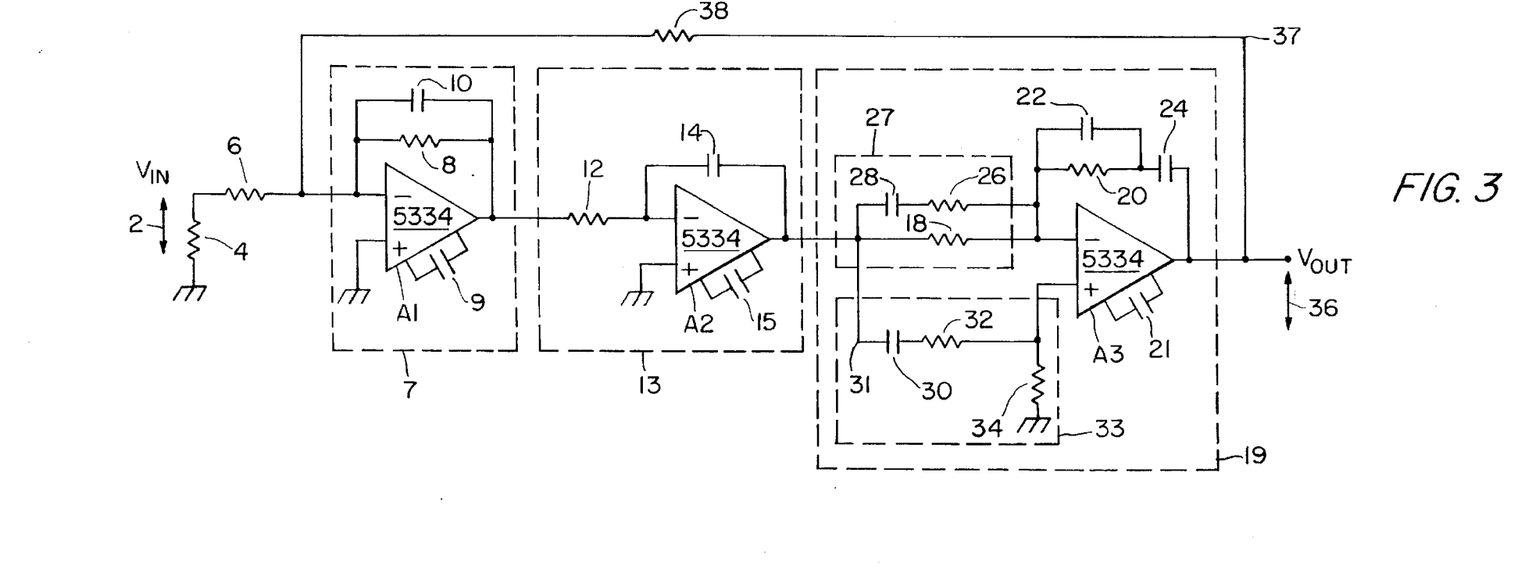
FIG. 3 is a schematic circuit diagram of a zero phase error amplifier system configured for optimal performance in 50 to 60 Hz frequency region.

FIG. 3 shows an amplifying system designed for optimal performance in the frequency range of 50 Hz to 60 Hz. The system is suitable for power factor measurement of devices used in the electrical distribution network. Each operational amplifier includes an external compensation capacitor (i.e., capacitors 9, 15, and 21) used for optimization of the frequency response of the respective amplifier. The following are the component values used in the system: $R_4=47\Omega$ $R_6=470\Omega$, $R_8=3.9k\Omega$, $R_{12}=1k\Omega$, $R_{18}=1k\Omega$, $R_{26}=1.5k\Omega$, $R_{20}=3.3k\Omega$, $R_{32}=8.2k\Omega$, $R_{34}=1K\Omega$, $R_{38}=47k\Omega$, $C_9=22pF$, $C_{10}=6.8nF$, $C_{14}=22nF$, $C_{15}=22pF$, and $C_{21}=22pF$, $C_{22}=3.3nF$, $C_{24}=22nF$, $C_{28}=22nF$, and $C_{30}=68nF$.

FIGS. 4A, 4B, 4C, and 4D are asymptotic Bode diagrams corresponding to sections 7, 13, 19, and 33, respectively. As conventional, the Bode diagrams show the cut-off frequency $f_o$ at minus 3 dB of the gain and the phase shift changing from an initial value at about $0.1 \cdot f_o$ to a final value at about $10 \cdot f_o$, wherein at $f_o$ the phase change is $45°$.

Figure 4A:
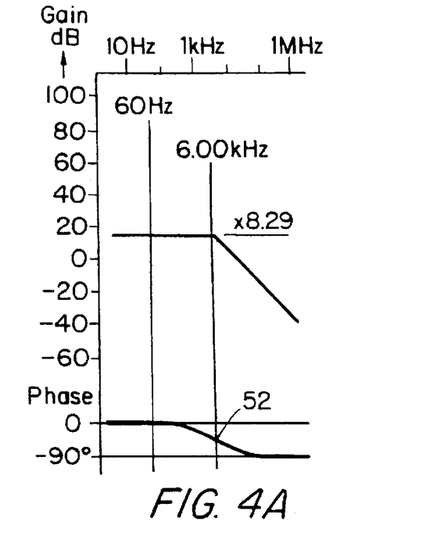
FIGS. 4A, 4B and 4C are Bode diagrams for each stage of the amplifier system of FIG. 3, respectively.

Referring to FIGS. 3 and 4A, the first stage has the low frequency gain reduced by resistor 8 to about 18.4 dB with a cut-off frequency at about 6 kHz. This initial roll-off frequency is substantially higher than the selected frequency of operation (i.e., 50/60 Hz) and is chosen to limit the high frequency noise. The gain through this stage is controlled by the values of resistor 8 and capacitor 10 and is not significantly affected by the open loop gain of operational amplifier A1. The first stage has a minus 90° phase shift centered at 6.0 kHz.

Figure 4B:
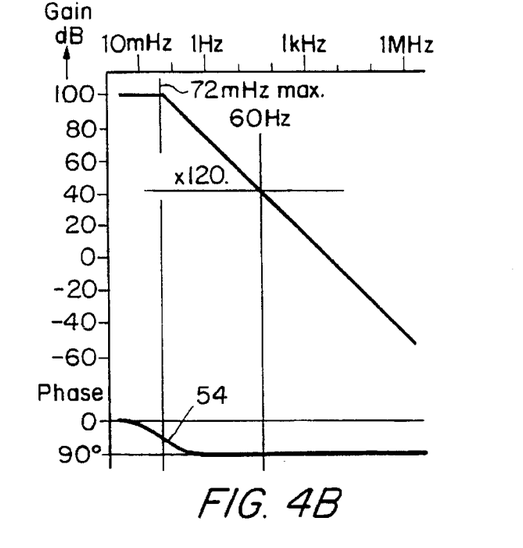

The second stage is a wide band integrator with a DC gain of operational amplifier A2 of about $10^5$ and the initial roll-off frequency at about 72 mHz. Capacitor 14 and resistor 12 control the gain at 60 Hz that is about 41 dB (i.e., $A=(\omega C_{14}R_{12})^{-1}$). The phase shift of operational amplifier A2 (line 54) is minus 90° centered at 72 mHz (FIG. 4B).

Figure 4C:
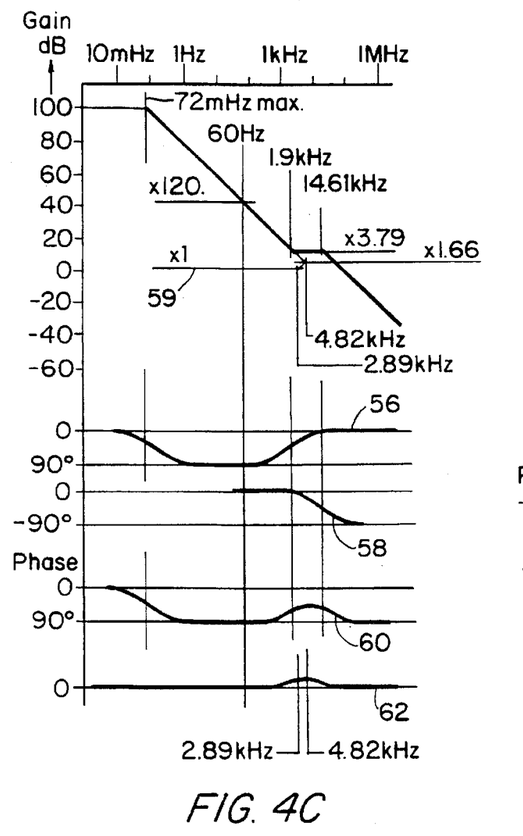

Referring also to FIG. 4C, the third stage includes input network 27 and phase compensation network 33 connected to operational amplifier A3. The DC gain is again about $10^5$ and the initial roll-off frequency is about 72 mHz. This provides an additional minus 90° phase shift located substantially below the frequency of operation (50/60 Hz). At frequencies below $10^3$ Hz, the phase shift (line 56) and the gain (line 55) are controlled by capacitance 24 that is much larger than capacitance 22 and creates the forward gain of about 41 dB at 60 Hz (i.e., $A=(\omega C_{24} R_{18})^{-1}$). At a frequency of about 1.9 kHz, due to the decreasing reactance of capacitor 24, presence of resistor 20 becomes pronounced ($R_{20} \cong (\omega C_{24})^{-1}$), and thus there is a frequency independent region in the gain characteristic. The gain is about 3.79 and is determined as a ratio of the feedback resistance 20 and input resistance of the input network 27. At a higher frequency of about 14.6 kHz, wherein the reactance of capacitor 22 equals resistance 20 ($R_{20} =(\omega C_{22})^{-1}$) the gain is again decreasing with frequency at minus 1 slope.

The third stage exhibits a minus 90° phase shift centered around the 72 mHz cut-off frequency and a plus 90° phase shift centered around the 1.9 kHz frequency, both shown as line 56 in FIG. 4C. There is an additional minus 90° phase shift (line 58) centered at the 14.61 kHz roll-off frequency. The phase dependence of the feedback network is shown as line 60 (addition of lines 56 and 58). Frequency dependence of the gain of input network 27 is shown as line 59 in FIG. 4C. At frequencies below 2.89 kHz, input network 27 is frequency independent since only a very small current flows through capacitor 28. Between 2.89 kHz and 4.82 kHz current flow in the capacitor-resistor loop is limited by decreasing reactance of capacitor 28, and thus there is a gain increase with slope plus 1. At the 4.82 kHz frequency, wherein the reactance of capacitor 28 equals resistance 26 $((\omega C_{28})^{-1}=R_{26})$, the current in the capacitor-resistor loop is limited only by resistors 18 and 26, and thus the gain is frequency independent. Input network 27 creates a phase lead, shown in FIG. 4C as line 62, which provides a phase margin.

Figure 3A:
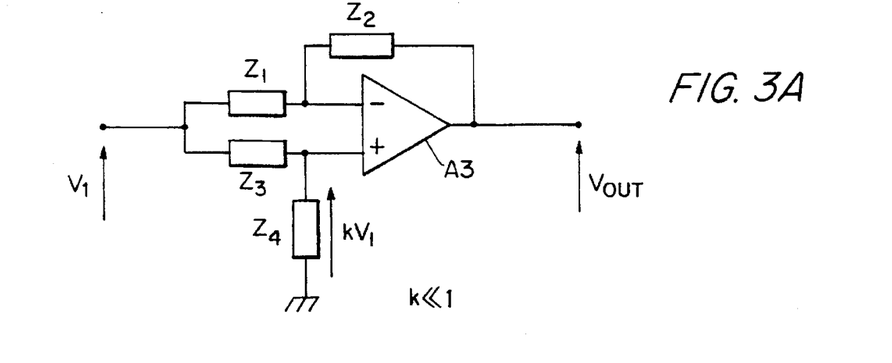
FIGS. 3A is a simplified schematic diagram for explanation of the phase compensation network of the amplifier system of FIG. 3.

Action of phase compensation network 33 is explained in a simplified schematic circuit diagram in FIG. 3A. Impedances $Z_1$, $Z_2$, $Z_3$, and $Z_4$ represent input network 27, feedback loop of amplifier $A_3$, loop 31 comprising capacitor 30 and resistor 32, and resistor 34, respectively. Voltage coupled to the positive node of amplifier $A_3$ is attenuated by an attenuator network formed by impedances $Z_3$ and $Z_4$ and can be represented as $kV_{in}$, wherein the attenuation factor k is much smaller than one. At low frequencies, wherein feedback loop impedance $Z_2$ is much larger than impedance $Z_1$ of input network 27, the gain of phase compensation network 33 is expressed as follows:

$$\frac{V_{out}}{V_i} \cong \frac{Z_2}{Z_1} (1-k) \qquad (5)$$

Figure 4D:
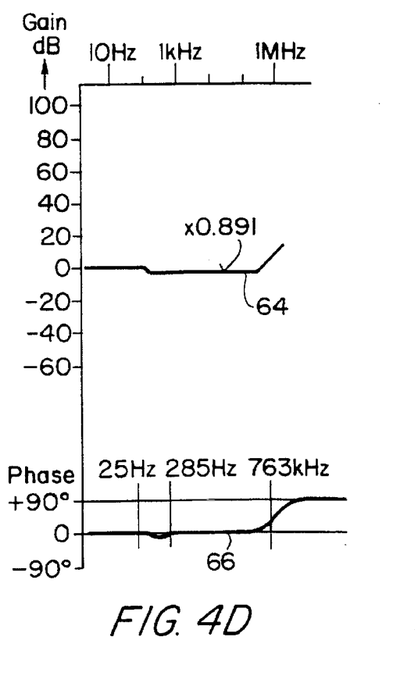
FIG. 4D is a Bode diagram of the phase compensation network of FIG. 3.

FIG. 4D depicts frequency dependence of the gain (line 64) and the phase (line 66) of phase compensation network 33. At low frequencies, there is practically no current in loop 31 due to a large reactance of capacitor 30. At about 254 Hz, wherein the reactance of capacitor 30 is comparable to resistance 32 and 34, there is a frequency dependent increase in the current, and thus the forward gain is reduced. At about 285 Hz, the reactance of capacitor 30 is comparable resistances 32, which now limits the current, and thus the forward gain is frequency independent. The action of capacitor 30 creates a phase lag in the 254 Hz to 285 Hz frequency region. This lag counteracts the above-described phase increase from minus 90° centered at 1.9 kHz, caused by the feedback loop of amplifier A3 and maintains the phase shift close to minus 180° in the 50 Hz to 60 Hz frequency range.

Figure 5A:
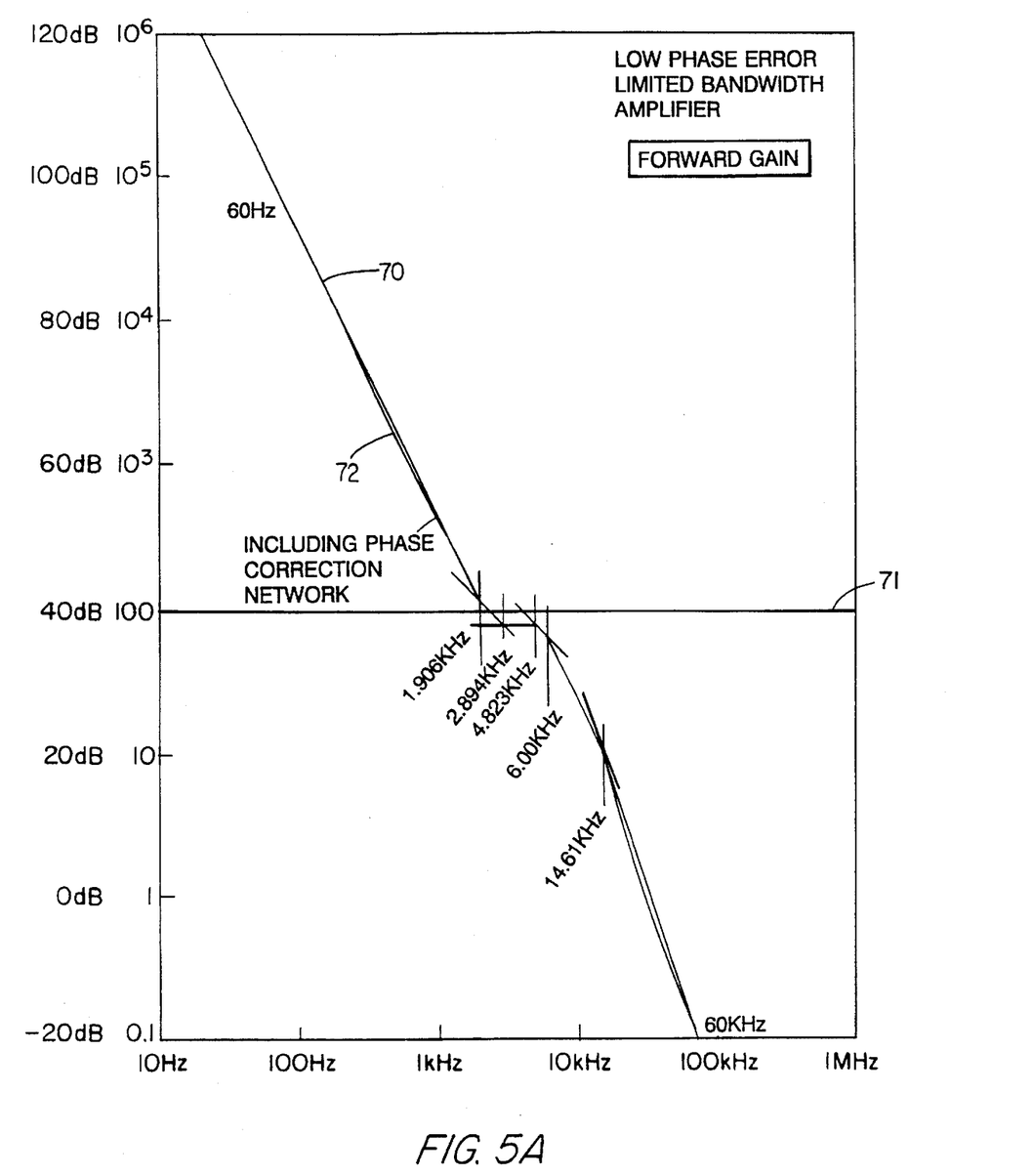
FIG. 5A is a graph of the forward gain of the amplifying system of FIG. 3.

FIG. 5A displays frequency dependence of the overall gain of the amplifying network (line 70). At frequencies above 72 mHz, the gain decreases with frequency at the rate of 40 dB per decade due to the action of the second and third stage. Between 1.9 kHz and 2.89 kHz the gain decreases at the rate of 20 dB per decade and is frequency independent in the range from 2.89 kHz to 4.82 kHz due to the above-described action of the local feedback network and input network 27 of the third stage. Above 4.82 kHz the gain decreases at the rate of 20 dB per decade, and above 6 kHz the rate is increased to 40 dB per decade due to the action of the first stage. Above 14.6 kHz, wherein the forward gain of the third stage decreases with frequency, the forward gain of the network rolls off at 60 dB per decade. The action of the amplifying network with phase compensation network 33 is shown by a broken line 72. The closed loop gain, determined as the ratio of resistances 38 and 6, is shown as line 71.

Figure 5B:
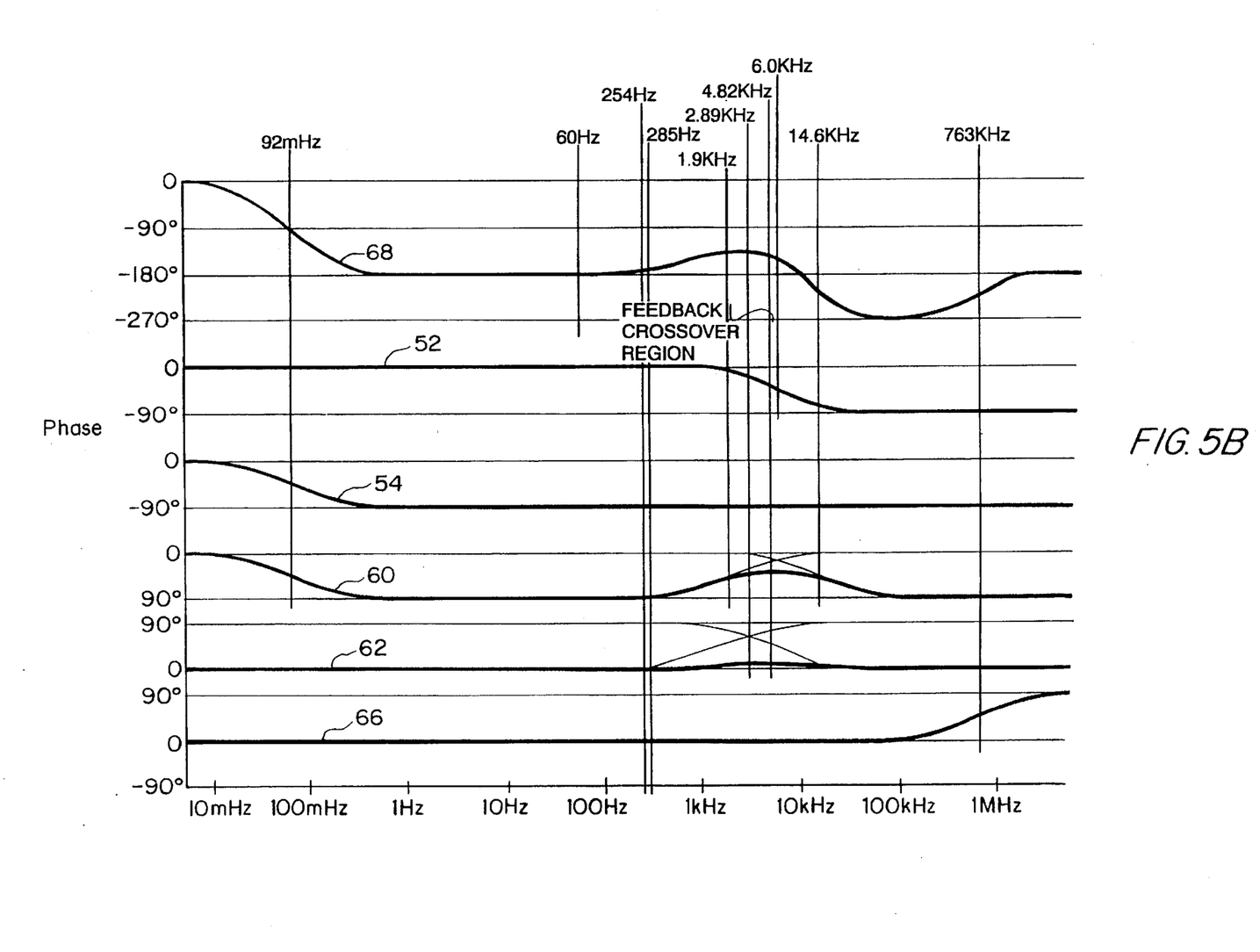
FIG. 5B displays frequency dependence of the phase for the amplifier system of FIG. 3.

FIG. 5B depicts the frequency dependence of the phase for the first stage (line 52), second stage (line 54), third stage (lines 60, 62 and 66), and the phase shift of the whole network (line 68).

Figure 6:
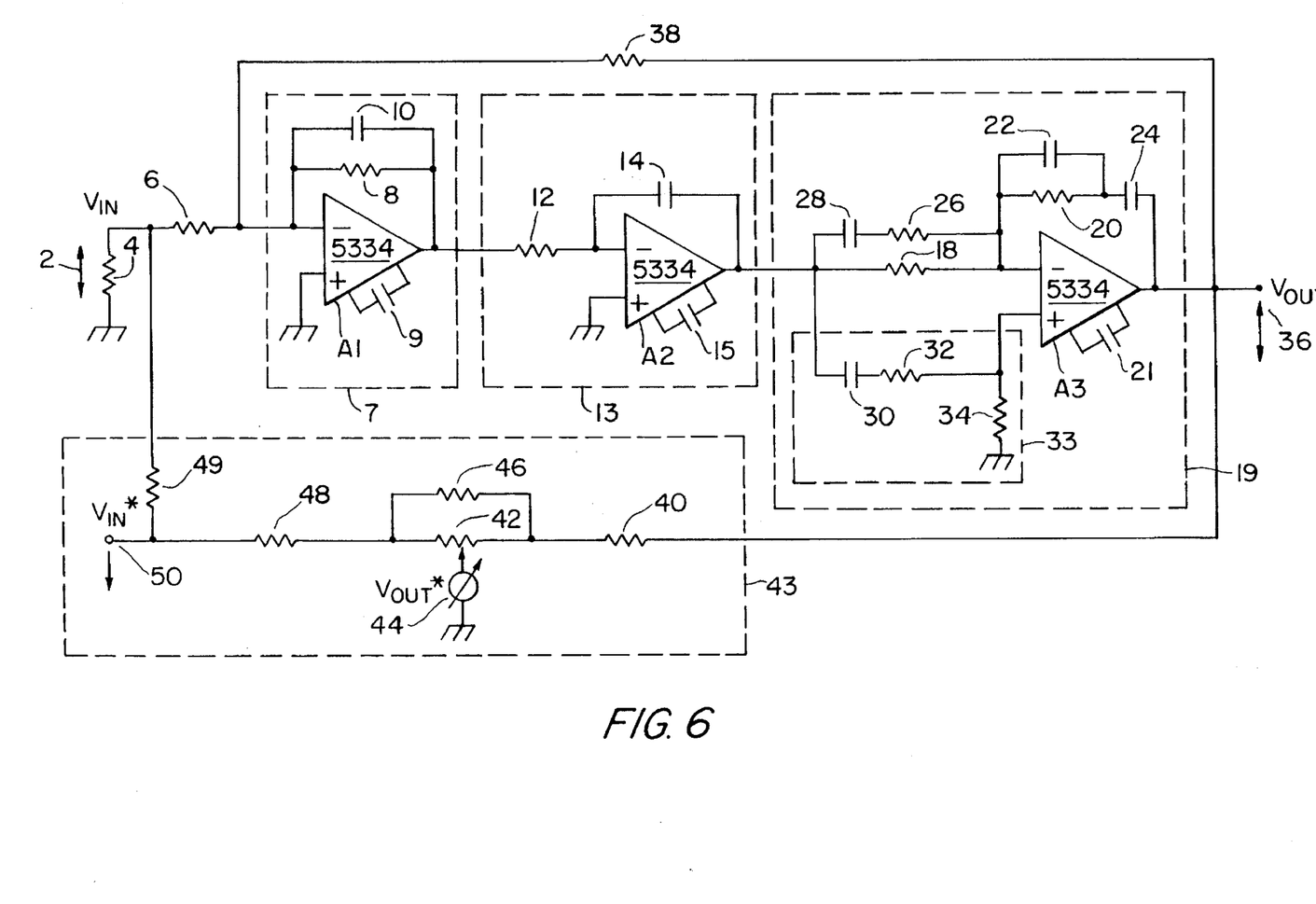
FIG. 6 is a schematic circuit diagram of the system of FIG. 3 including a phase error measurement network.
Figure 7:
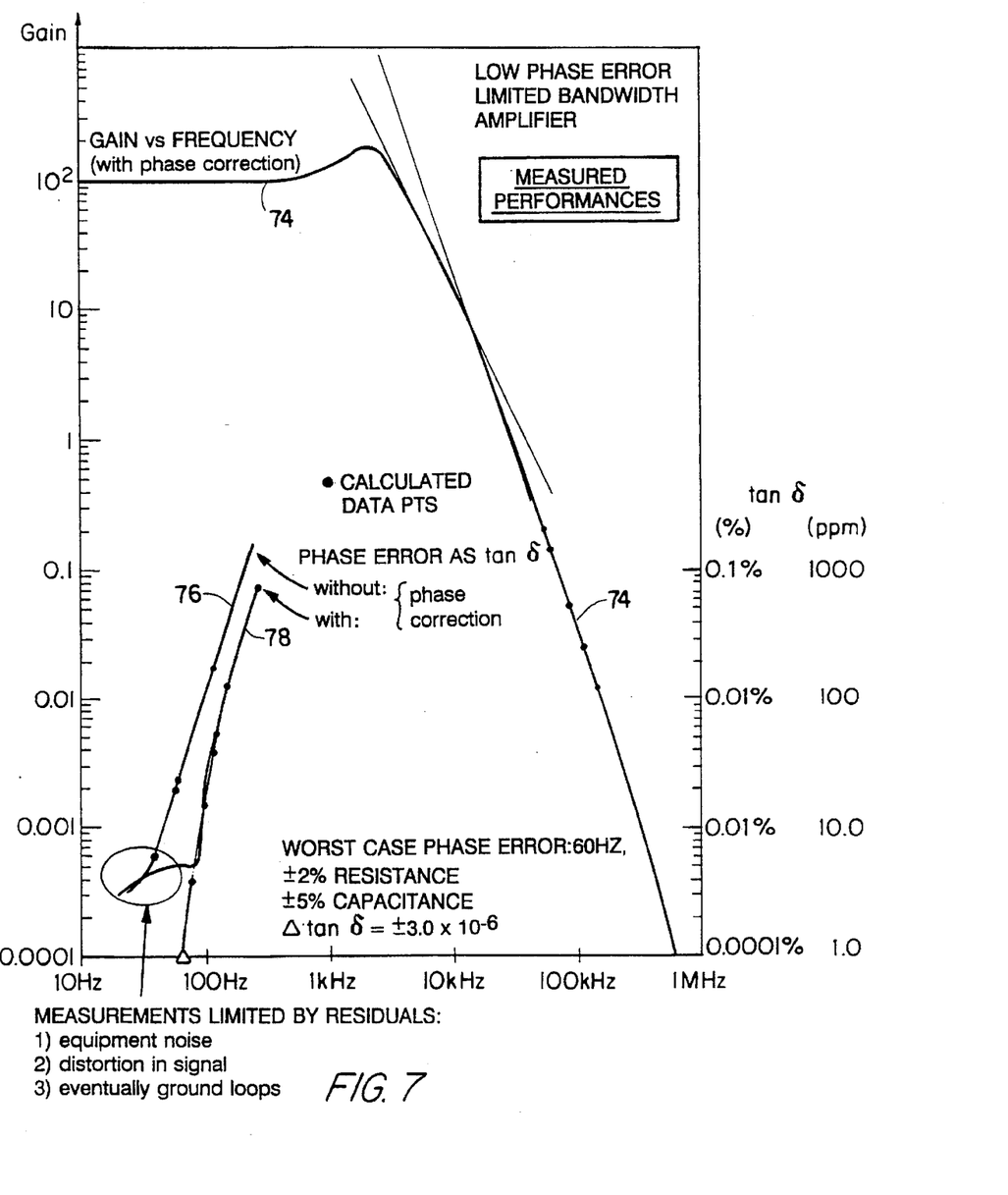
FIG. 7 displays graphs of the measured gain and phase error of the amplifier system of FIG. 6.

FIG. 7 depicts the phase error of the amplifying system measured using a phase error measurement network 43 of shown in FIG. 6. A low distortion sinusoidal signal V* in is applied at an input mode 50 and an output signal V*$_{out}$ is detected at a node 44 using a high gain detector oscilloscope. The resistor values are as follows: $R_4$=47Ω, $R_{40}$=10kΩ, $R_{42}$=1kΩ, $R_{46}$=100Ω, $R_{48}$=10kΩ, and $R_{49}$=4.23kΩ. An attenuated signal is applied to amplifier input 2 and is compared at amplifier output 36. The detector oscilloscope indicates a vector sum of $V_i$ and $V_{out}$. Potentiometer 42 is used to balance out the in-line element to detect the 90° component of the vector sum, i.e., to detect the phase error.

The frequency response of the measured gain of the whole system (line 74 of FIG. 7) exhibits a first order pole at about 12 kHz and a second order pole at about 4 kHz with a 6 dB peak. The measured phase error tan δ is plotted as lines 78 and 76 for the amplifying system with and without phase compensation network 33. At frequencies around 60 Hz, the phase error is so small that the measurement is limited by other effects such as equipment noise or input signal distortion. The amplifying system with phase compensation network 33 has a phase error less than 3 ppm.

Figure 8:
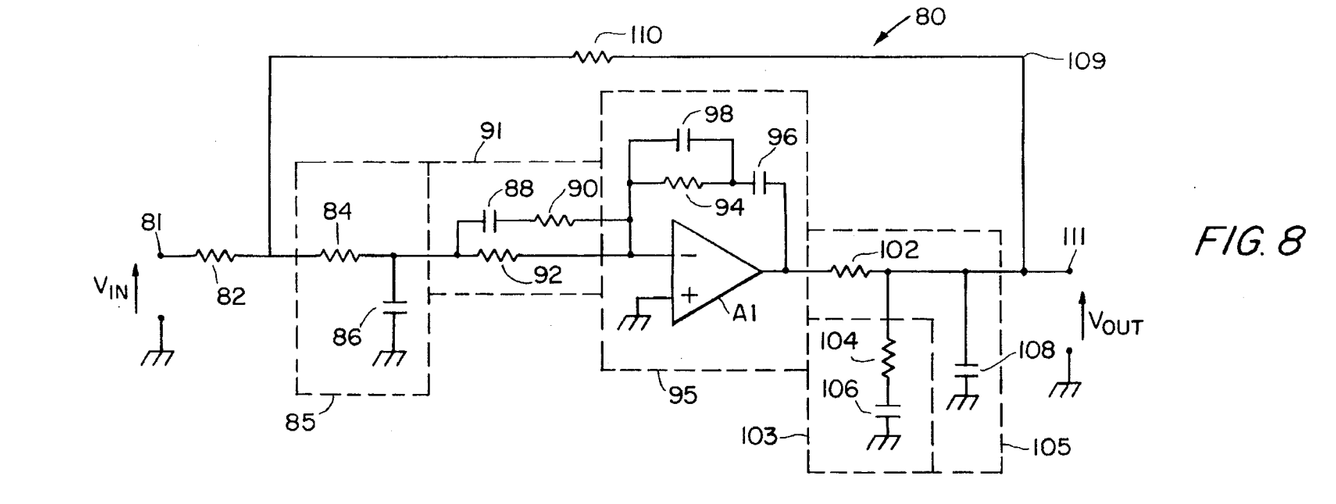
FIG. 8 is a schematic circuit diagram of an inverter system with a very small phase error according to another embodiment of the invention.

Another embodiment of a low phase error amplifier is shown in FIG. 8. An amplifier system 80 includes an input resistor 82, passive low pass filters 85 and 105, active low pass filter 95, a phase correction network 103, input network 91 acting as a phase lead network, and a global resistive feedback loop 109. Active low pass filter 95 includes an operational amplifier A1 with a very high DC gain, capacitors 96 and 98 and a resistor 94, connected in a negative feedback loop that define the frequency dependence of the gain. Active filter 95 is adapted to provide an initial roll-off frequency substantially below a selected frequency of operation and a very high forward gain at the operating frequencies. One of the two low pass filters has a cut-off frequency substantially below the operating frequencies, and the other filter has a cut-off frequency substantially above the operating frequencies. Phase correction network 103 is designed to maintain the phase shift close to minus 180° at the operating frequencies. Input network 91 provides phase margin in the same way as network 27 of FIG. 3. Above the third cut-off frequency that is substantially above the operating frequencies, the phase shift is increased to minus 270° and the forward gain is rolled off at 60 dB per decade beyond the loop crossover frequency. The closed loop gain of system 80 is set by feedback resistance 110 and input resistance 82. Low pass filter 105 and high frequency attenuator 103 can also be located on the input side of operational amplifier A1; other different circuit topologies are possible as well.

Figure 9A:
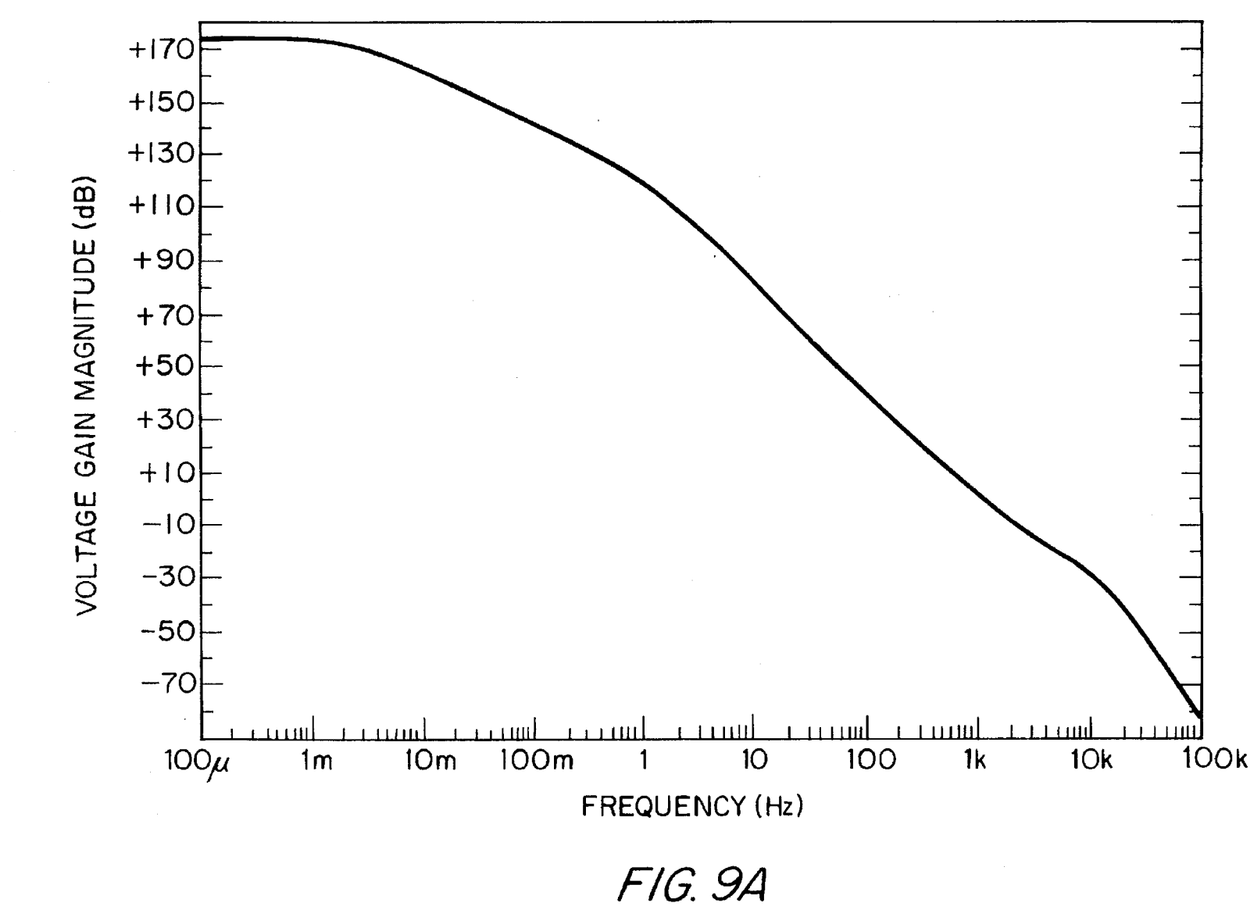
FIGS. 9A and 9B are Bode diagrams for the inverter system of FIG. 8.
Figure 9B:
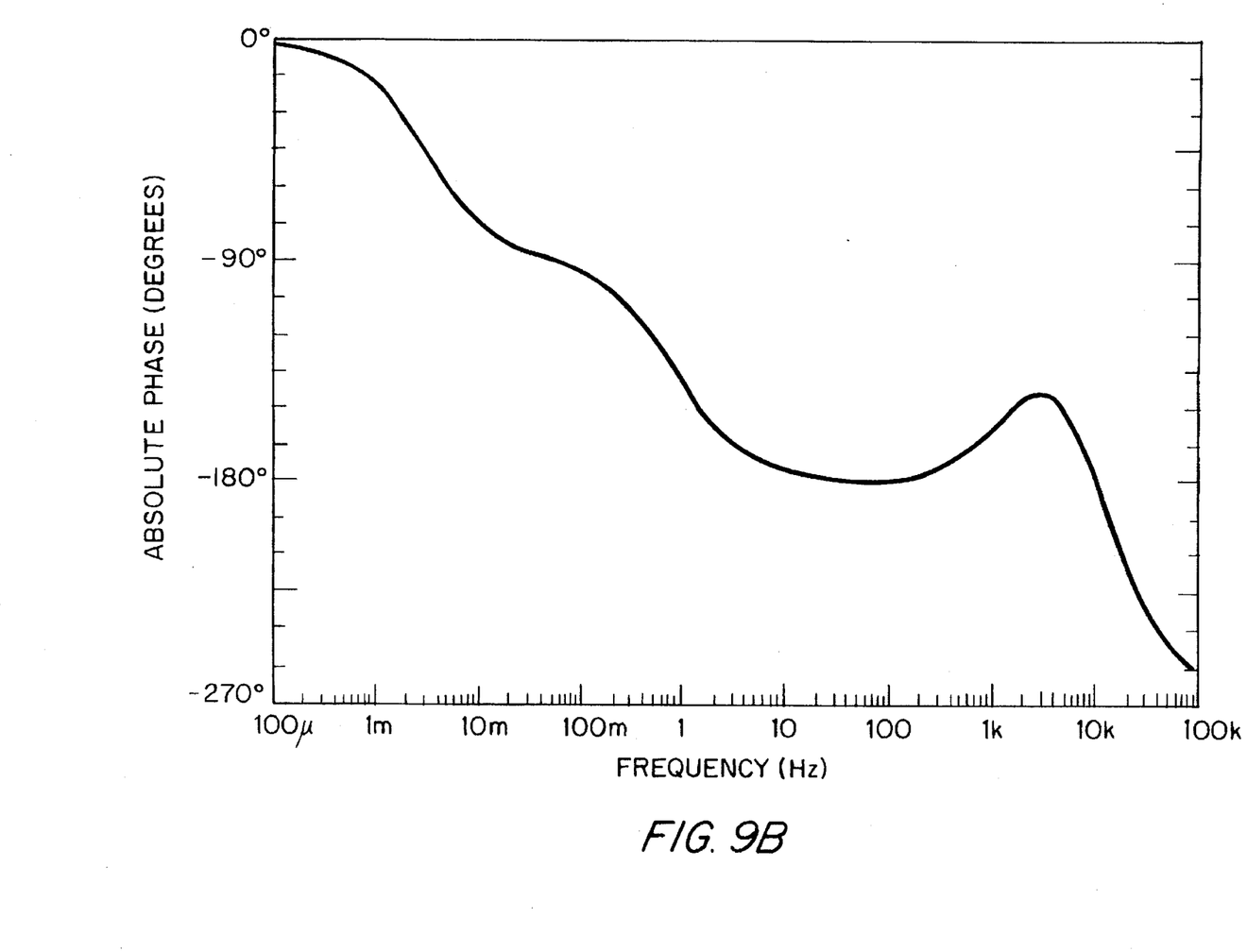

The following are values of capacitors and resistors of amplifying system 80 designed for operation in the range of 50 Hz to 60 Hz: $R_{82}$=1kΩ, $R_{84}$=10kΩ, $R_{92}$=10kΩ, $R_{94}$=22MΩ, $R_{102}$=10Ω, $R_{104}$=82Ω, $R_{110}$=1kΩ, $C_{86}$=39μF, $C_{88}$=2.2nF, $C_{98}$=0.5pF, $C_{96}$=3.3pF, $C_{106}$=11μF, and $C_{108}$=2.65μF. Also referring to FIGS. 9A and 9B, the small values of capacitors 96, 98, and the very high value resistance 94 achieve a very high forward gain of stage 95 at low frequencies and an initial roll-off frequency of about 5 mHz. The forward gain of stage 95 decreases with frequency to about 2.2 kHz, wherein reactance of capacitor 96 approaches resistance 94, and becomes frequency independent up to about 14.5 kHz. Above 14.5 kHz, wherein reactance of capacitor 98 is lower than resistance 94, the forward gain of stage 95 again decreases with frequency at 20 dB per decade. Therefore, the phase is shifted minus 90° centered around 5 mHz, plus 90° 2.2 kHz, and minus 90° centered around 14.5 kHz, as shown in FIG. 9B that display the resulting phase of the system.

Low pass filter 85 has a frequency independent gain at very low frequencies and the initial roll-off frequency at about 800 mHz, controlled by resistances 84 and 92 and capacitance 86. Thus, there is a minus 90° phase shift centered at about 800 mHz. Input network 91 increases the phase margin at the crossover frequency which is the same as for the above-described input network 27 of FIG. 3, (lines 59 and 62 of FIG. 4C).

First order low pass filter 105 has the initial roll-off frequency centered about 6 kHz, given by resistance 102 and capacitance 108. High frequency attenuator 103 reduces the gain at frequencies above 200 Hz and creates a phase lag, in the 40 Hz to 100 Hz region (not visible in FIG. 9B due to the coarse scale), which opposes the plus 90° shift in phase produced by active filter 95; this phase lag maintains the phase very close to minus 180° at the operating frequencies. Since the overall gain of system 80 is determined by 1 kΩ resistances 82 and 110, the system acts an inverter.

Figure 10:
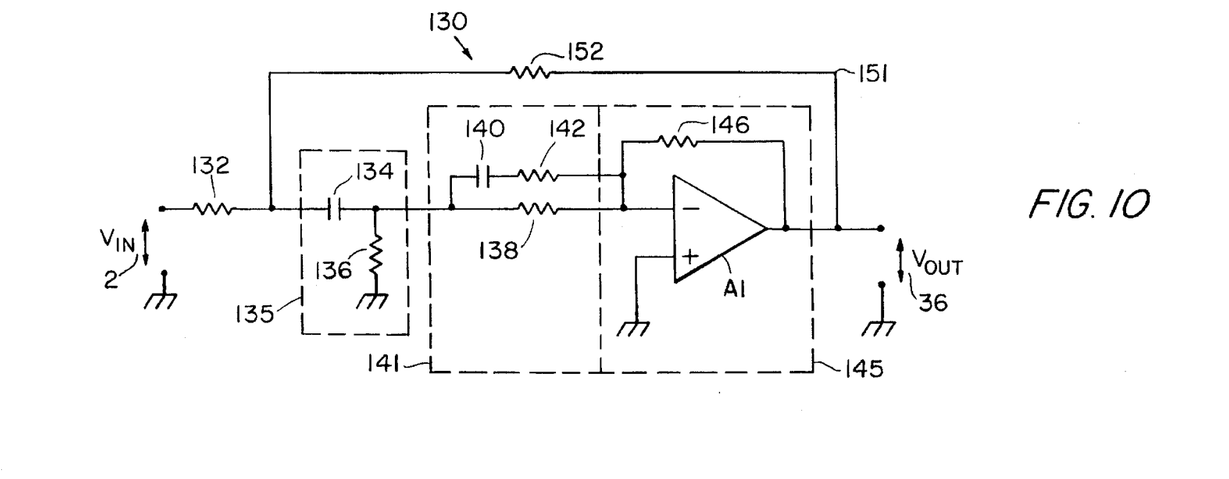
FIG. 10 is a schematic circuit diagram of a low phase error amplifier according to another embodiment of the invention.
Figure 11A:
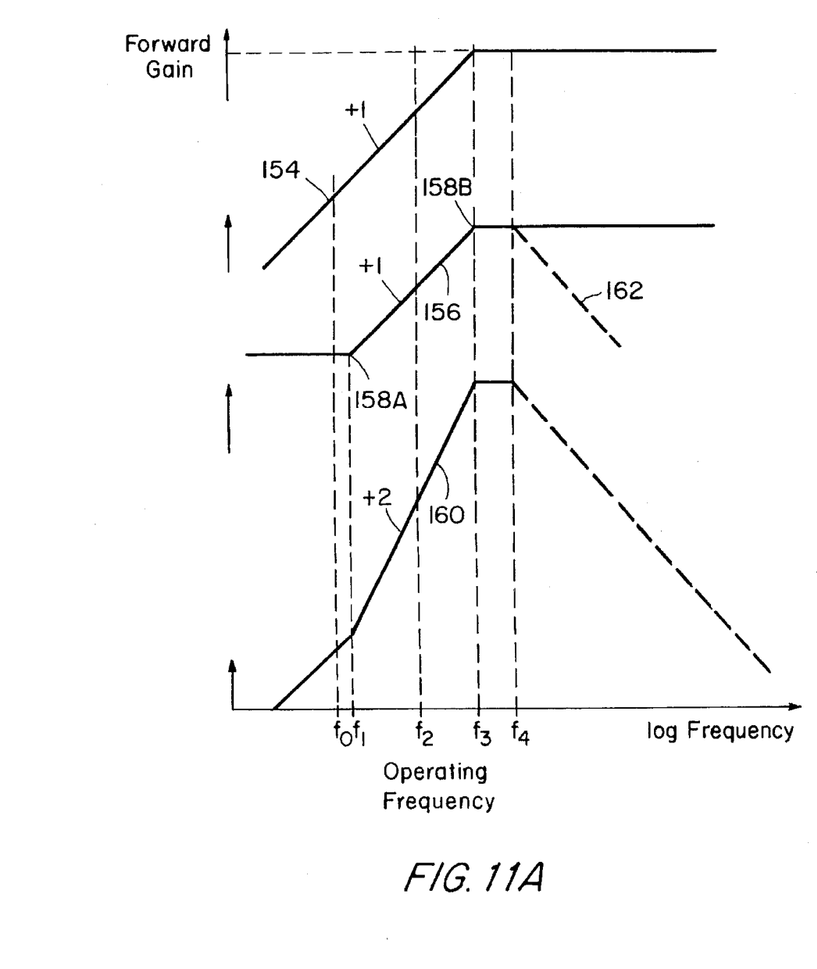
FIGS. 11A and 11B are Bode diagrams for the low phase error amplifier of FIG. 10.

Another embodiment of a low phase error amplifier 130 is shown in FIG. 10. Amplifier 130 includes an input resistor 132, a high pass filter 135 formed by a capacitor 134 and a resistor 136, an input network 141 formed by a capacitor 140 and resistors 138 and 142, a amplifier stage 145, and a global feedback loop 151. Referring also to FIG. 11A current through capacitor 134 increases with frequency with a slope plus one (line 154) up to a cut-off frequency $f_3$ of high pass filter 135, selected to be substantially above operating frequency $f_2$. In input network 141, resistances 138 and 142 and capacitance 140 are selected to achieve a frequency independent gain for low and high frequencies, substantially below and above the operating frequencies, (line 156). The low frequency break point $f_1$ in controlled by resistance 138 and capacitance 140, and the high frequency break point $f_3$ is controlled by resistance 142 and capacitance 140. It may be desirable to obtain substantially equal roll-off frequency of high pass filter 135 and input network 141.

Figure 11B:
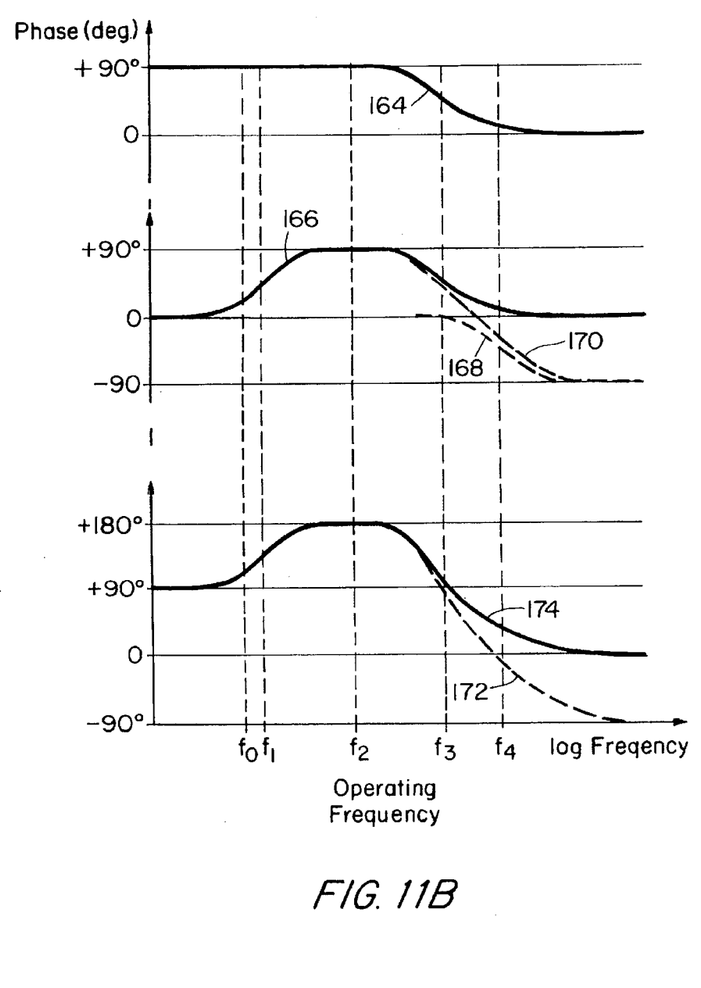

Filter 135 and network 141 provide a 40 dB per decade increase in the forward gain (line 160). The necessary high forward gain, in the operating frequency region, is achieved by amplifier stage 145 by selecting the ratio of feedback resistance 146 and impedance of input network 141. Referring to FIG. 11B, the phase of high pass filter 135 changes from plus 90° to 0° at frequencies around the cut-off frequency $f_3$ (line 164). Frequency dependence of the phase of input network 141 exhibits a plus 90° phase shift centered around $f_1$ and minus 90° phase shift centered around $f_3$ (line 166). Line 168 shows a minus 90° phase shift due to the high frequency roll off of amplifier A1 and line 170 is addition of lines 166 and 168. The resulting frequency dependence of the phase of amplifier 130 is shown as lines 172 and 174 with and without the amplifier's roll-off, respectively. At high frequencies, there is a 20 dB per decade gain decrease (broken line 162) due to the own roll off of amplifier A1. Thus, at the operating frequencies, the phase is shifted to plus 180°. The overall gain of the amplifying system 130 is controlled by input resistance 132 and feedback resistance 152.

Figure 12A:
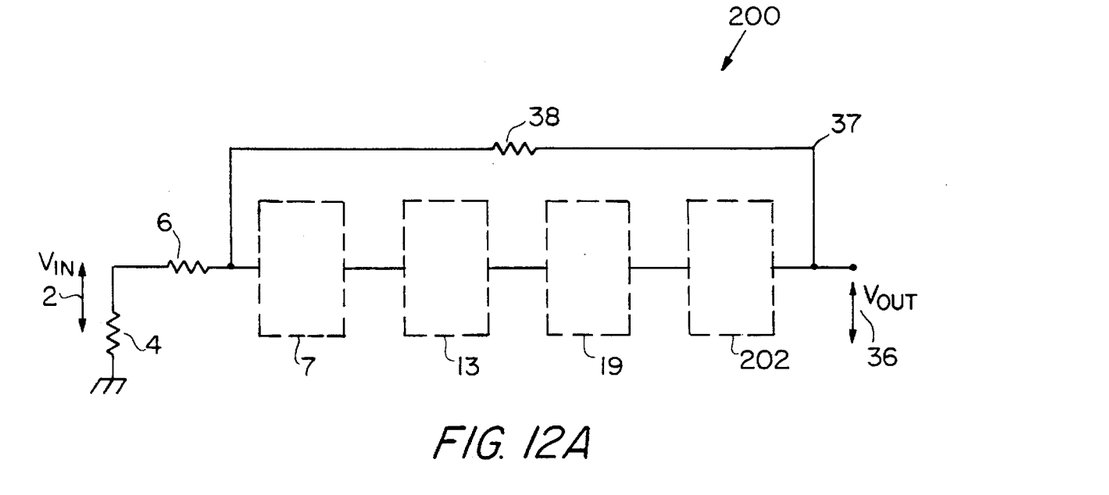
FIGS. 12A and 12B are block diagrams of improved embodiments of the amplifier system of FIG. 1.
Figure 12B:
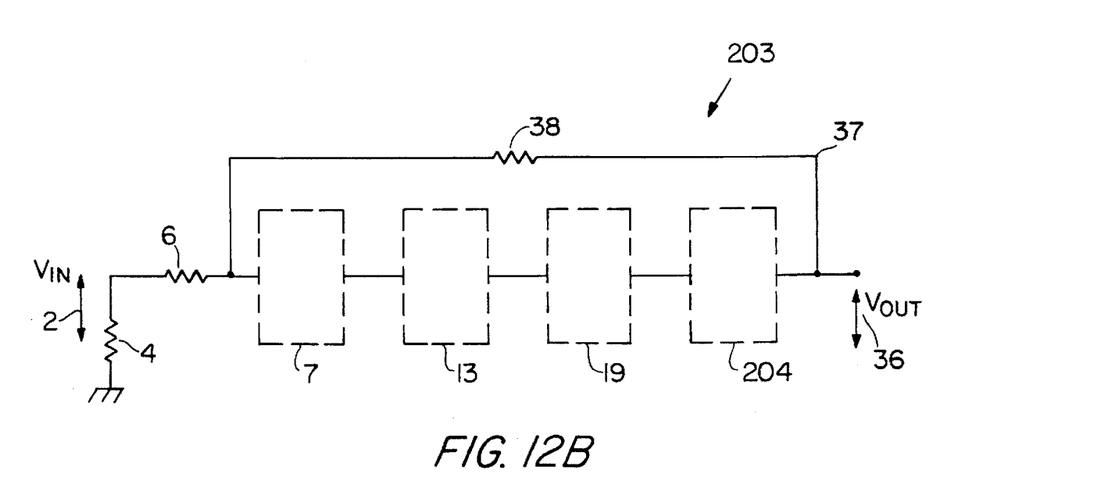

An improved embodiment of the amplifier of FIG. 1 is shown in FIGS. 12A and 12B. In FIG. 12A, an amplifying apparatus 200 includes three amplifying stages 7, 13, and 19, described in connection with FIGS. 1 and 3, as well as a cascaded notch filter 202. Notch filter 202 does not affect the forward gain and the phase of the apparatus except in the notch frequency region. The notch frequency is selected to be substantially above the operating frequencies of the amplifier, wherein the loop gain of the system is relatively low, and in a frequency region, wherein it is desirable to reduce a high frequency noise caused by some other source. For example, when the low phase error amplifier is used with a high frequency switching amplifier that generates a high voltage test signal, notch filter 202 with a frequency above 10 kHz can be used to eliminate the high frequency noise. Alternatively, notch filter 202 may be replaced with a low pass filter 204, shown diagrammatically in FIG. 12B, which has a cut-off frequency above 10 kHz and a forward gain of one at frequencies below the cut-off frequency.

Figure 13:
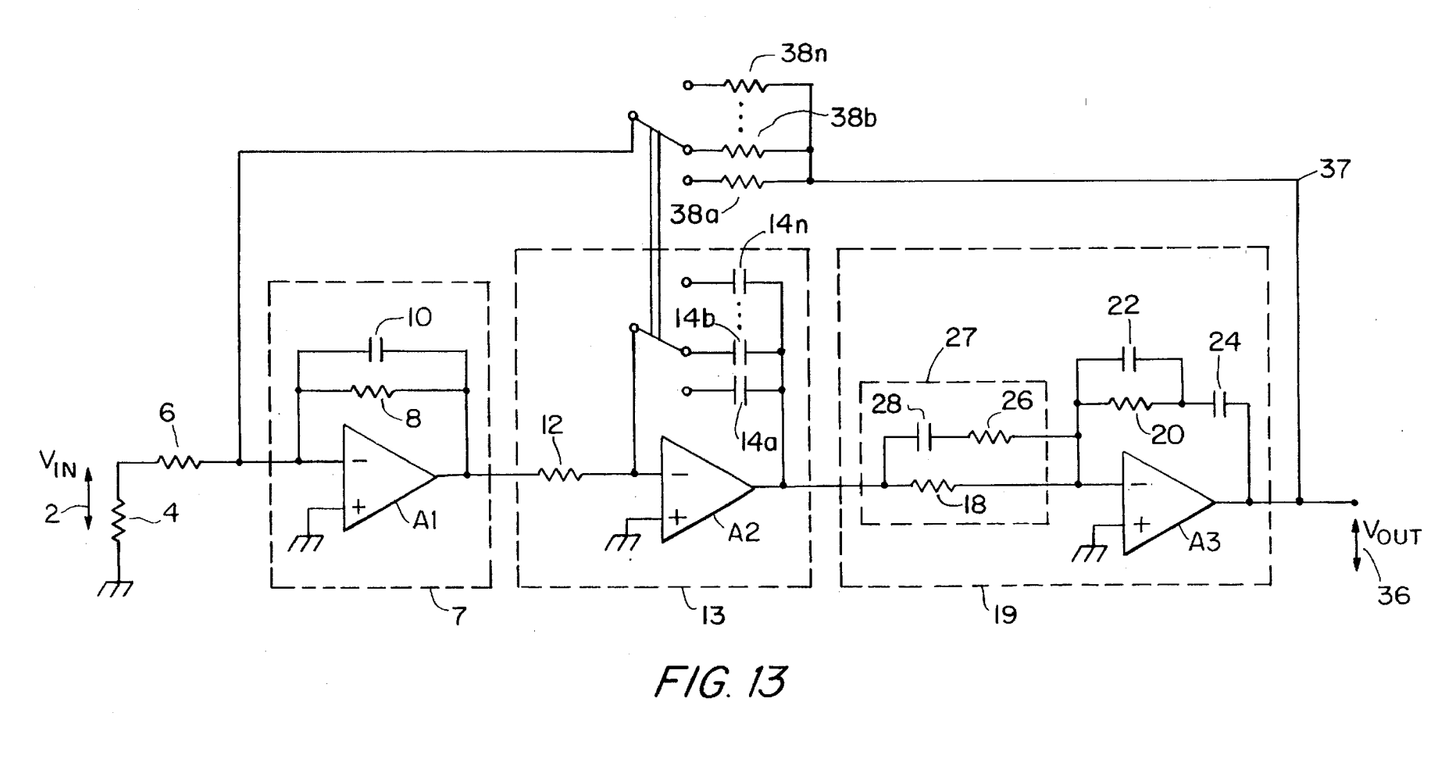
FIG. 13 is a schematic circuit diagram of a low phase error ranging amplifier.

Referring to FIG. 13, the amplifier system of FIG. 1 can be modified to create a ranging amplifier system that has a switchable gain. The forward gain of the ranging amplifier is varied by switching to different values of capacitor 14 which affect the initial roll-off frequency and the gain of stage 13. The closed loop gain of the ranging amplifier is varied by switching to different values of resistor 38. For example, capacitances 14a, 14b, . . . , 14n can have values C, C/k, . . . , C/n·k, respectively, and resistances 38a, 38b, . . . , 38n can have values R, k·R, . . . , n·k·R, respectively. Thus, by switching to a higher range, the forward gain at the desired operating frequencies is increased, and the closed loop gain is also increased. Alternatively, instead of switchable capacitance 14, the ranging amplifier can have switchable feedback elements in stages 7 or 19, or input elements in stages 7, 13 or 19, all of which affect the forward gain; however, the switching should not affect the phase of the forward gain in the restricted pass band, as is the case in the above-described ranging amplifier.

Other embodiments are within the following claims.

I claim:

1. Amplifying apparatus exhibiting a nearly zero phase error in a desired frequency band, said apparatus comprising:

three cascaded amplifiers including local feedback loops formed by a network constructed and arranged to exhibit a high forward gain in said frequency band, each said amplifier with its respective local feedback loop arranged to form a low pass filter, said network creating, in said frequency band, substantially 180 degree phase shift between an input voltage and an output voltage of said amplifying apparatus, a resistive global feedback loop arranged to connect the output of the third amplifier and the input of the first amplifier, and said global feedback loop adapted to control the closed loop gain of said amplifying apparatus.

2. The apparatus of claim 1 wherein at least one amplifier further comprises a phase compensation network arranged to increase the frequency range over which said 180 degree phase shift is achieved.

3. The apparatus of claim 1 wherein said local feedback loop of one amplifier comprises a capacitor and a resistor connected in parallel adapted to establish a cut-off frequency substantially above said frequency band.

4. The apparatus of claim 3 wherein at least one amplifier further comprises an input network.

5. The apparatus of claim 4 wherein said input network comprises a capacitor-resistor loop and a resistor loop connected in parallel.

6. The apparatus of claim 5 wherein at least one amplifier further comprises a phase compensation network arranged to increase the frequency range over which said 180 degree phase shift is achieved.

7. The apparatus of claim 1 wherein each said amplifier comprises a capacitor adapted and arranged for phase compensation.

8. The apparatus of claim 1 further comprising a high frequency noise reduction stage, cascaded to said amplifiers, constructed and arranged to reduce noise of frequencies substantially above said frequency band.

9. The apparatus of claim 1 wherein said frequency band is 50 Hz to 60 Hz.

10. Amplifying apparatus having a nearly zero phase error in a desired frequency band, said apparatus comprising:

an amplifier, having inverting and noninverting inputs and an output, constructed and arranged to operate as a low pass filter with a high gain and to have a cut-off frequency substantially below said frequency band, a signal input node adapted to introduce an input voltage to said inverting input, a signal output node adapted to obtain an output voltage from said output of said amplifier, a capacitor-resistor network constructed and arranged to provide, in connection with said amplifier, substantially 180 degree phase shift between said input voltage and said output voltage in said frequency band, and a resistive global feedback loop connecting said signal input and signal output nodes adapted to control the closed loop gain of the amplifying apparatus.

11. The apparatus of claim 10 wherein said capacitor-resistor network is connected between said signal input node and said inverting input of said amplifier.

12. The apparatus of claim 10 wherein said capacitor-resistor network is connected between said output of said amplifier and said signal output node.

13. The apparatus of claim 10 wherein said capacitor resistor network comprises a first passive low pass filter with a cut-off frequency substantially below said frequency band, and a second passive low pass filter with a cut-off frequency substantially above said frequency band.

14. The apparatus of claim 13 further comprising a high frequency attenuator adapted to reduce the forward gain at high frequencies.

15. The apparatus of claim 13 further comprises a phase compensation network arranged to increase the frequency range over which said 180° phase shift is achieved.

16. The apparatus of claim 13 further comprising an input network connected to said inverting input, said input network being formed by a capacitor-resistor loop and a resistor loop connected in parallel.

17. The apparatus of claim 13 further comprising a phase lead network connected to said amplifier, said phase lead network being formed by a capacitor-resistor loop and a resistor loop connected in parallel.

18. Amplifying apparatus having a nearly zero phase error in a frequency band, said apparatus comprising:

at least two cascaded amplifiers including local feedback loops formed by a network constructed and arranged to exhibit a high forward gain, said local feedback loops constructed and arranged to establish a predetermined restricted pass band containing said frequency band, said network creating, in said frequency band, substantially 180° phase shift between an input voltage and an output voltage of said amplifying apparatus, a resistive global feedback loop arranged to connect the output of the second amplifier and the input of the first amplifier, and said global feedback loop adapted to control the closed loop gain of said amplifying apparatus.

19. The apparatus of claim 18 wherein each of said amplifiers with said local feedback loop is constructed and arranged to form a low pass filter.

20. The apparatus of claim 18 wherein the overall gain is one.

21. The apparatus of claim 18 wherein the overall gain is larger than one.

22. The apparatus of claim 18 wherein said frequency band is 50 Hz to 60 Hz.

23. Amplifying apparatus having a nearly zero phase error in a desired frequency band, said apparatus comprising:

at least one amplifier, having inverting and noninverting inputs and an output, including a local feedback loop formed by a network, all constructed and arranged to exhibit a high forward gain in said frequency band, a signal input node adapted to introduce an input voltage to said inverting input, a signal output node adapted to obtain an output voltage from said output of said amplifier, said amplifier and said network constructed and arranged to exhibit substantially 180 degree phase shift between said input voltage and said output voltage in said frequency band, and a resistive global feedback loop connecting said signal input and signal output nodes adapted to control the closed loop gain of the amplifying apparatus.

24. The apparatus of claim 23 further comprising a high frequency attenuator adapted to reduce the forward gain at high frequencies substantially above said frequency band.

25. The apparatus of claim 23 further comprises a phase compensation network arranged to increase a frequency range over which said 180° phase shift is achieved.

26. The apparatus of claim 23 further comprising a phase lead network connected to said amplifier, said phase lead network being formed by a capacitor-resistor loop and a resistor loop connected in parallel.

* * * * *